(12) United States Patent  
Fitzgerald

(10) Patent No.: US 7,465,619 B2  
(45) Date of Patent: Dec. 16, 2008

(54) METHODS OF FABRICATING DUAL LAYER SEMICONDUCTOR DEVICES

(75) Inventor: Eugene A. Fitzgerald, Windham, NH (US)

(73) Assignee: Amberwave Systems Corporation, Salem, NH (US)

( * ) Notice: Subject to any disclaimer, the term of this patent is extended or adjusted under 35 U.S.C. 154(b) by 190 days.

(21) Appl. No.: 11/130,575

(22) Filed: May 17, 2005

(65) Prior Publication Data

US 2005/0221550 A1 Oct. 6, 2005

Related U.S. Application Data

(63) Continuation of application No. 10/216,085, filed on Aug. 9, 2002, now Pat. No. 6,974,735.

(60) Provisional application No. 60/311,188, filed on Aug. 9, 2001.

(51) Int. Cl.
*H01L 21/8238* (2006.01)
(52) U.S. Cl. ............................... 438/199; 438/285
(58) Field of Classification Search ............... 438/175, 438/199, 282, 285, 590, 933; 257/18, 19, 257/190, 192, 194, 351, 616
See application file for complete search history.

(56) References Cited

U.S. PATENT DOCUMENTS

| 4,497,683 | A | | 2/1985 | Celler et al. |
| 4,692,992 | A | * | 9/1987 | Hsu ........................ 438/223 |
| 4,710,788 | A | | 12/1987 | Dämbkes et al. |
| 4,920,076 | A | | 4/1990 | Holland et al. |
| 4,990,979 | A | | 2/1991 | Otto |
| 5,079,447 | A | * | 1/1992 | Lien et al. .................. 326/110 |
| 5,089,872 | A | | 2/1992 | Ozturk et al. |
| 5,155,571 | A | | 10/1992 | Wang et al. |
| 5,241,197 | A | | 8/1993 | Murakami et al. |
| 5,242,847 | A | | 9/1993 | Ozturk et al. |

(Continued)

FOREIGN PATENT DOCUMENTS

DE 41 01 167 A1 7/1992

(Continued)

OTHER PUBLICATIONS

"2 Bit/Cell EEPROM Cell Using Band-to-Band Tunneling for Data Read-Out," *IBM Technical Disclosure Bulletin*, vol. 35, No. 4B (Sep. 1992) pp. 136-140.

(Continued)

*Primary Examiner*—Thien F Tran
(74) *Attorney, Agent, or Firm*—Goodwin Procter LLP

(57) ABSTRACT

A semiconductor-based device includes a channel layer, which includes a distal layer and a proximal layer in contact with the distal layer. The distal layer supports at least a portion of hole conduction for at least one p-channel component, and the proximal layer supports at least a portion of electron conduction for at least one n-channel component. The proximal layer has a thickness that permits a hole wave function to effectively extend from the proximal layer into the distal layer to facilitate hole conduction by the distal layer. A method for fabricating a semiconductor-based device includes providing a distal portion of a channel layer and providing a proximal portion of the channel layer.

18 Claims, 5 Drawing Sheets

U.S. PATENT DOCUMENTS

| | | | |
|---|---|---|---|
| 5,266,510 A | 11/1993 | Lee | |
| 5,266,521 A | 11/1993 | Lee et al. | |
| 5,291,439 A | 3/1994 | Kauffmann et al. | |
| 5,312,766 A | 5/1994 | Aronowitz et al. | |
| 5,327,375 A | 7/1994 | Harari | |
| 5,442,205 A | 8/1995 | Brasen et al. | |
| 5,461,243 A | 10/1995 | Ek et al. | |
| 5,479,033 A | 12/1995 | Baca et al. | |
| 5,523,592 A | 6/1996 | Nakagawa et al. | |
| 5,534,713 A | 7/1996 | Ismail et al. | |
| 5,596,527 A | 1/1997 | Tomioka et al. | |
| 5,617,351 A | 4/1997 | Bertin et al. | |
| 5,683,934 A | 11/1997 | Candelaria | |
| 5,739,567 A | 4/1998 | Wong | |
| 5,777,347 A | 7/1998 | Bartelink | |
| 5,780,922 A | 7/1998 | Mishra et al. | |
| 5,786,612 A | 7/1998 | Otani et al. | |
| 5,792,679 A | 8/1998 | Nakato | |
| 5,808,344 A | 9/1998 | Ismail et al. | |
| 5,847,419 A | 12/1998 | Imai et al. | |
| 5,891,769 A | 4/1999 | Liaw et al. | |
| 5,906,951 A | 5/1999 | Chu et al. | |
| 5,951,757 A | 9/1999 | Dubbelday et al. | |
| 5,963,817 A | 10/1999 | Chu et al. | |
| 5,986,287 A | 11/1999 | Eberl et al. | |
| 5,998,807 A | 12/1999 | Lustig et al. | |
| 6,013,134 A | 1/2000 | Chu et al. | |
| 6,058,044 A | 5/2000 | Sugiura et al. | |
| 6,059,895 A | 5/2000 | Chu et al. | |
| 6,096,590 A | 8/2000 | Chan et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,130,453 A | 10/2000 | Mei et al. | |
| 6,143,636 A | 11/2000 | Forbes et al. | |
| 6,154,475 A | 11/2000 | Soref et al. | |
| 6,204,529 B1 | 3/2001 | Lung et al. | |
| 6,207,977 B1 | 3/2001 | Augusto | |
| 6,228,694 B1 | 5/2001 | Doyle et al. | |
| 6,235,568 B1 | 5/2001 | Murthy et al. | |
| 6,249,022 B1 | 6/2001 | Lin et al. | |
| 6,251,755 B1 | 6/2001 | Furukawa et al. | |
| 6,266,278 B1 | 7/2001 | Harari et al. | |
| 6,281,532 B1 | 8/2001 | Doyle et al. | |
| 6,326,664 B1 | 12/2001 | Chau et al. | |
| 6,339,232 B1 | 1/2002 | Takagi | |
| 6,350,993 B1 | 2/2002 | Chu et al. | |
| 6,399,970 B2 | 6/2002 | Kubo et al. | |
| 6,407,406 B1 | 6/2002 | Tezuka | |
| 6,437,375 B1 | 8/2002 | Beaman | |
| 6,461,945 B1 | 10/2002 | Yu | |
| 6,498,359 B2 | 12/2002 | Schmidt et al. | |
| 6,555,839 B2 | 4/2003 | Fitzgerald | |
| 6,563,152 B2 | 5/2003 | Roberds et al. | |
| 6,583,437 B2 | 6/2003 | Mizuno et al. | |
| 6,593,191 B2 | 7/2003 | Fitzgerald | |
| 6,593,625 B2 | 7/2003 | Christiansen et al. | |
| 6,593,641 B1 | 7/2003 | Fitzergald | |
| 6,600,170 B1 | 7/2003 | Xiang | |
| 6,603,156 B2 | 8/2003 | Rim | |
| 6,605,498 B1 | 8/2003 | Murthy et al. | |
| 6,621,131 B2 | 9/2003 | Murthy et al. | |
| 6,657,223 B1 | 12/2003 | Wang et al. | |
| 6,677,192 B1 | 1/2004 | Fitzgerald | |
| 6,693,641 B1 | 2/2004 | Mehta et al. | |
| 6,703,688 B1 | 3/2004 | Fitzergald | |
| 6,730,551 B2 | 5/2004 | Lee et al. | |
| 6,737,670 B2 | 5/2004 | Cheng et al. | |
| 6,743,684 B2 | 6/2004 | Liu | |
| 6,861,318 B2 | 3/2005 | Murthy et al. | |
| 6,885,084 B2 | 4/2005 | Murthy et al. | |
| 6,921,913 B2 | 7/2005 | Yeo et al. | |
| 6,940,089 B2 * | 9/2005 | Cheng et al. | 257/19 |
| 7,001,837 B2 | 2/2006 | Ngo et al. | |
| 7,141,820 B2 | 11/2006 | Lee et al. | |
| 2001/0003364 A1 | 6/2001 | Sugawara et al. | |
| 2002/0063292 A1 | 5/2002 | Armstrong et al. | |
| 2002/0100942 A1 | 8/2002 | Fitzgerald et al. | |
| 2002/0123197 A1 | 9/2002 | Fitzgerald et al. | |
| 2002/0125471 A1 | 9/2002 | Fitzgerald et al. | |
| 2002/0125497 A1 | 9/2002 | Fitzgerald | |
| 2002/0140031 A1 | 10/2002 | Rim | |
| 2002/0167048 A1 * | 11/2002 | Tweet et al. | 257/347 |
| 2002/0190284 A1 | 12/2002 | Murthy et al. | |
| 2002/0197803 A1 | 12/2002 | Leitz et al. | |
| 2003/0013323 A1 | 1/2003 | Hammond et al. | |
| 2003/0052334 A1 | 3/2003 | Lee et al. | |
| 2003/0057439 A1 | 3/2003 | Fitzgerald | |
| 2003/0077867 A1 | 4/2003 | Fitzgerald | |
| 2003/0089901 A1 | 5/2003 | Fitzgerald | |
| 2003/0227013 A1 | 12/2003 | Currie et al. | |
| 2004/0007724 A1 | 1/2004 | Murthy et al. | |
| 2004/0014276 A1 | 1/2004 | Murthy et al. | |
| 2004/0026765 A1 | 2/2004 | Currie et al. | |
| 2004/0119101 A1 | 6/2004 | Schrom et al. | |
| 2005/0017236 A1 | 1/2005 | Sugii et al. | |
| 2005/0023554 A1 * | 2/2005 | Chu et al. | 257/190 |
| 2005/0151164 A1 | 7/2005 | Leitz et al. | |
| 2006/0266997 A1 | 11/2006 | Currie et al. | |
| 2007/0072354 A1 | 3/2007 | Lee et al. | |

FOREIGN PATENT DOCUMENTS

| | | |
|---|---|---|
| EP | 0 683 522 A2 | 11/1995 |
| EP | 0 828 296 | 3/1998 |
| EP | 0 829 908 A2 | 3/1998 |
| EP | 0 838 858 A2 | 4/1998 |
| EP | 0 844 651 A1 | 5/1998 |
| EP | 1 020 900 A2 | 7/2000 |
| EP | 1 174 928 A1 | 1/2002 |
| JP | 63122176 | 5/1988 |
| JP | 4-307974 | 10/1992 |
| JP | 7-106446 | 4/1995 |
| JP | 9-219524 | 8/1997 |
| JP | 11-233744 | 8/1999 |
| JP | 2000-21783 | 1/2000 |
| JP | 2001319935 | 5/2000 |
| JP | 2001-160594 | 6/2001 |
| JP | 2001-168342 | 6/2001 |
| JP | 02241195 | 8/2002 |
| WO | WO 98/59365 | 12/1998 |
| WO | WO 99/53539 | 10/1999 |
| WO | WO 00/54338 | 9/2000 |
| WO | WO 01/54202 | 7/2001 |
| WO | WO 01/93338 | 12/2001 |
| WO | WO 01/99169 | 12/2001 |
| WO | WO 02/13262 | 2/2002 |
| WO | WO 02/15244 | 2/2002 |
| WO | WO 02/47168 | 6/2002 |
| WO | WO 02/071488 | 9/2002 |
| WO | WO 02/071491 | 9/2002 |
| WO | WO 02/071495 | 9/2002 |

OTHER PUBLICATIONS

Aigouy et al., "MOVPE Growth and optical characterization of ZnSe/ZnS strained layer superlattices," *Superlattices and Microstructures*, vol. 16, No. 1 (1994) pp. 71-76.

Anonymous, "Germanium P-Channel Mosfet," *IBM Technical Disclosure Bulletin*, vol. 28, No. 2 (Jul. 1, 1985) p. 500.

Armstrong et al., "Design of Si/SiGe Heterojunction Complementary Metal-Oxide-Semiconductor Transistors," *IEDM Technical Digest* (1995) pp. 761-764.

Armstrong, "Technology for SiGe Heterostructure-Based CMOS Devices," Submitted to the Massachusetts Institute of Technology Department of Electrical Engineering and Computer Science on Jun. 30, 1999, pp. 1-154.

Barradas et al., "RBS analysis of MBE-grown Si/Ge/(001) Si heterostructures with thin, high Ge content SiGe channels for HMOS transistors," *Modern Physics Letters B* (2001) (abstract).

Bouillon et al., "Search for the optimal channel architecture for 0.18/0.12 μm bulk CMOS Experimental study," *IEEE*, (1996) pp. 21.2.1-21.2.4.

Bufler et al., "Hole transport in strained $Si_{1-x}Ge_x$ alloys on $Si_{1-y}Ge_y$ substrates," *Journal of Applied Physics*, vol. 84, No. 10 (Nov. 15, 1998) pp. 5597-5602.

Canaperi et al., "Preparation of a relaxed Si-Ge layer on an insulator in fabricating high-speed semiconductor devices with strained epitaxial films," *Intern. Business Machines Corporation*, USA (2002) (abstract).

Carlin et al., "High Efficiency GaAs-on-Si Solar Cells with High $V_\alpha$ Using Graded GeSi Buffers," *IEEE* (2000) pp. 1006-1011.

Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001) pp. 321-323.

Cheng et al., "Relaxed Silicon-Germanium on Insulator Substrate by Layer Transfer," *Journal of Electronic Materials*, vol. 30, No. 12, 2001, pp. L37-L39.

Cullis et al, "Growth ripples upon strained SiGe epitaxial layers on Si and misfit dislocation interactions," *Journal of Vacuum Science and Technology A*, vol. 12, No. 4 (Jul./Aug. 1994) pp. 1924-1931.

Cullis et al, "The characteristics of strain-modulated surface undulations formed upon epitaxial $Si_{1-x}Ge_x$ alloy layers on Si," *Journal of Crystal Growth*, vol. 123 (1992) pp. 333-343.

Currie et al., "Carrier mobilities and process stability of strained S in- and p-MOSFETs on SiGe virtual substrates," *J. Vac. Sci. Technol. B.*, vol. 19, No. 6 (Nov./Dec. 2001) pp. 2268-2279.

Currie et al., "Controlling threading dislocation densities in Ge on Si using graded SiGe layers and chemical-mechanical polishing," *Applied Physics Letters*, vol. 72, No. 14 (Apr. 6, 1998) pp. 1718-1720.

Eaglesham et al., "Dislocation-Free Stranski-Krastanow Growth of Ge on Si(100)," *Physical Review Letters*, vol. 64, No. 16 (Apr. 16, 1990) pp. 1943-1946.

Fischetti, "Long-range Coulomb interactions in small Si devices. Part II. Effective electronmobility in thin-oxide structures," *Journal of Applied Physics*, vol. 89, No. 2 (Jan. 15, 2001) pp. 1232-1250.

Fitzgerald et al., "Relaxed $Ge_xSi_{1-x}$ structures for III-V integration with Si and high mobility two-dimensional electron gases in Si," *J. Vac. Sci. Technol. B*, vol. 10, No. 4 (Jul./Aug. 1992) pp. 1807-1819.

Fitzgerald et al., "Dislocation dynamics in relaxed graded composition semiconductors," *Materials Science and Engineering B67*, (1999) pp. 53-61.

Fitzgerald et al., "Totally relaxed $Ge_xSi_{1-x}$ layers with low threading dislocation densities grown on Si substrates," *Appl. Phys. Lett.*, vol. 59, No. 7 (Aug. 12, 1991) pp. 811-813.

Garone et al., "Silicon vapor phase epitaxial growth catalysis by the presence of germane," *Applied Physics Letters*, vol. 56, No. 13 (Mar. 26, 1990) pp. 1275-1277.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531-2533.

Hackbarth et al., "Alternatives to thick MBE-grown relaxed SiGe buffers," *Thin Solid Films*, vol. 369, No. 1-2 (2000) pp. 148-151.

Hackbarth et al., "Strain relieved SiGe buffers for Si-based heterostructure field-effect transistors," *Journal of Crystal Growth*, vol. 201 (1999) pp. 734-738.

Herzog et al., "SiGe-based FETs: buffer issues and device results," *Thin Solid Films*, vol. 380 (2000) pp. 36-41.

Höck et al., "Carrier mobilities in modulation doped $Si_{1-x}Ge_x$ heterostructures with respect to FET applications," *Thin Solid Films*, vol. 336 (1998) pp. 141-144.

Höck et al., "High hole mobility in $Si_{0.17}Ge_{0.83}$ channel metal-oxide-semiconductor field-effect transistors grown by plasma-enhanced chemical vapor deposition," *Applied Physics Letters*, vol. 76, No. 26, Jun. 26, 2000, pp. 3920-3922.

Höck et al., "High performance 0.25 μm p-type Ge/SiGe MODFETs," *Electronics Letters*, vol. 34, No. 19 (Sep. 17, 1998) pp. 1888-1889.

Ismail et al., "Modulation-doped n-type Si/SiGe with inverted interface," *Appl. Phys. Lett.*, vol. 65, No. 10 (Sep. 5, 1994) pp. 1248-1250.

Kearney et al., "The effect of alloy scattering on the mobility of holes in a $Si_{1-x}Ge_x$ quantum well," *Semicond. Sci Technol.*, vol. 13 (1998) pp. 174-180.

Kikkawa et al., "Effect of strained InGaAs step bunching on mobility and device performance in n-InGaP/InGaAs/GaAs pseudomorphic heterostructures grown by metalorganic vapor phase epitaxy," *Journal of Crystal Growth*, vol. 145 (1994) pp. 799-807.

König et al., "Design Rules for n-Type SiGe Hetero FETs," *Solid State Electronics*, vol. 41, No. 10 (1997), pp. 1541-1547.

König et al., "SiGe HFETs and HFETs," *Solid-State Electronics*, vol. 38, No. 9 (1995) pp. 1595-1602.

Lee et al., "Strained Ge channel p-type metal-oxide-semiconductor field-effect transistors grown on $Si_{1-x}Ge_x$/Si virtual substrates," *Applied Physics Letters*, vol. 79, No. 20, Nov. 12, 2001, pp. 3344-3346.

Lee et al., "Strained Ge channel p-type MOSFETs fabricated on $Si_{1-x}Ge_x$/Si virtual substrates," *Mat. Res. Soc. Symp. Proc.*, vol. 686, 2002, pp. A1.9.1-A1.9.5.

Leitz et al., "Channel Engineering of SiGe-Based Heterostructures for High Mobility MOSFETs," *Mat. Res. Soc. Symp. Proc.*, vol. 686, 2002, pp. A3.10.1-A3.10.6.

Leitz et al., "Dislocation glide and blocking kinetics in compositionally graded SiGe/Si," *Journal of Applied Physics*, vol. 90, No. 6 (Sep. 15, 2001) pp. 2730-2736.

Leitz et al., "Hole mobility enhancements in strained $Si/Si_{1-y}Ge_y$ p-type metal-oxide-semiconductor field-effect transistors grown on relaxed $Si_{1-x}Ge_x$ (x<y) virtual substrates," *Applied Physics Letters*, vol. 79, No. 25, Dec. 17, 2001, pp. 4246-4248.

Li et al., "Design of high speed Si/SiGe heterojunction complementary metal-oxide-semiconductor field effect transistors with reduced short-channel effects," *J. Vac. Sci. Technol.*, A 20(3), May/Jun. 2002, pp. 1030-1033.

Maiti et al., "Strained-Si heterostructure field effect transistors," *Semicond. Sci. Technol.*, vol. 13 (1998) pp. 1225-1246.

Meyerson et al., "Cooperative Growth Phenomena in Silicon/Germanium Low-Temperature Epitaxy," *Applied Physics Letters*, vol. 53, No. 25 (Dec. 19, 1988) pp. 2555-2557.

Mizuno et al., "Advanced SOI-MOSFETs with Strained-Si Channel for High Speed CMOS Electron/Hole Mobility Enhancement," *2000 Symposium on VLSI Digest of Technology Papers* (Jun. 13, 2000) pp. 210-211.

Mizuno et al., "Electron and Hole Mobility Enhancement in Strained-Si MOSFET's on SiGe-on-Insulator Substrates Fabricated by SIMOX Technology," *IEEE Electron Device Letters*, vol. 21, No. 5 (May 2000) pp. 230-232.

Nayak et al., "High Mobility Strained-Si PMOSFET's," *IEEE Transactions on Electron Devices*, vol. 43, No. 10 (Oct. 1996) 1709-1716.

O'Neill et al., "SiGe Virtual substrate N-channel heterojunction MOSFETS," *Semicond. Sci. Technol.*, vol. 14 (1999) pp. 784-789.

Parker et al., "SiGe heterostructure CMOS circuits and applications," *Solid State Electronics*, vol. 43, No. 8, (Aug. 1999) pp. 1497-1506.

Pelekanos et al., "Interface roughness correlation in CdTe/CdZnTe strained quantum wells," *Journal of Crystal Growth*, vol. 184/185 (1998) pp. 886-889.

Reinking et al., "Fabrication of High-Mobility Ge p-Channel MOSFETs on Si Substrates," *Electronics Letters*, vol. 35, No. 6 (Mar. 18, 1999) pp. 503-504.

Rim et al., "Enhanced Hole Mobilities in Surface-Channel Strained-Si p-MOSFETs," Solid State Electronics Laboratory, Stanford University, Stanford, CA 94305 (1995) pp. 20.3.1-20.3.4.

Rim et al., "Fabrication and Analysis of Deep Submicron Strained-Si N-MOSFET's," *IEEE Transactions on Electron Devices*, vol. 47, No. 7 (Jul. 2000) pp. 1406-1415.

Rim, "Application of Silicon Based Heterostructures to Enhanced Mobility Metal-Oxide-Semiconductor Field-Effect Transistors," Ph.D. Thesis, Stanford University (Jul. 1999) pp. 1-184.

Robbins et al., "A model for heterogeneous growth of $Si_{1-x}Ge_x$ films for hydrides," *Journal of Applied Physics*, vol. 69, No. 6 (Mar. 15, 1991) pp. 3729-3732.

Rosenblad et al., "Virtual Substrates for the n- and p-type Si-MODFET Grown at Very High Rates," *Materials Science and Engineering*, vol. B74 (2000) pp. 113-117.

Sadek et al., "Design of Si/SiGe Heterojunction Complementary Metal-Oxide-Semiconductor Transistors," *IEEE Transactions on Electron Devices*, vol. 43, No. 8 (Aug. 1996) pp. 1224-1232.

Schäffler, "High-mobility Si and Ge structures," *Semicond. Sci. Technol.*, vol. 12 (1997) pp. 1515-1549.

Srolovitz, "On the Stability of Surfaces of Stresses Solids," *Acta metall.*, vol. 37, No. 2 (1989) pp. 621-625.

Tweet et al., "Factors determining the composition of strained GeSi layers grown with disilane and germane," *Applied Physics Letters*, vol. 65, No. 20 (Nov. 14, 1994) pp. 2579-2581.

Ueno et al., "Low Temperature Buffer Growth for Modulation Doped SiGe/Ge/SiGe Heterostructures with High Hole Mobility," *Thin Solid Films*, vol. 369 (2000) pp. 320-323.

Usami et al., "Spectroscopic study of Si-based quantum wells with neighboring confinement structure," *Semicon. Sci. Technol.* (1997) (abstract).

Welser et al., "Evidence of Real-Space Hot-Electron Transfer in High Mobility, Strained-Si Multilater MOSFETs," *Electron Devices meetings. 1993. Technical Digest* (Dec. 1993) pp. 21.3.1-21.3.4.

Welser, "The Application of Strained Silicon/Relaxed Silicon Germanium Heterostructures to Metal-Oxide-Semiconductor Field-Effect Transistors," Ph.D. Thesis, Stanford University (1995) pp. 1-205.

Wesler et al., "Electron Mobility Enhancement in Strained-Si N-Type Metal-Oxide-Semiconductor Field-Effect Transistors," *IEEE Electron Device Letters*, vol. 15, No. 3 (Mar. 1994) pp. 100-102.

Wesler et al., "NMOS and PMOS Transistors Fabricated in Strained Silicon/Relaxed Silicon-Germanium Structures," *Electron Devices Meeting, 1992. Technical Digest* (Dec. 13, 1992) pp. 31.7.1-31.7.3.

Wolf et al., "Silicon Processing for the VLSI Era, vol. 1: Process Technology" (1986) pp. 201.

Xie et al., "Semiconductor Surface Roughness: Dependence on Sign and Magnitude of Bulk Strain," *The Physical Review Letters*, vol. 73, No. 22 (Nov. 28, 1994) pp. 3006-3009.

Xie et al., "Very high mobility two-dimensional hole gas in Si/$GexSi_{1-x}$/Ge structures grown by molecular beam epitaxy," *Appl. Phys. Lett.*, vol. 63, No. 16 (Oct. 18, 1993) pp. 2263-2264.

Xie, "SiGe Field effect transistors," *Materials Science and Engineering*, vol. 25 (1999) pp. 89-121.

Yeo et al., "Enhanced Performance in Sub-100 nm CMOSFETs Using Strained Epitaxial Silicon-Germanium" IEEE, *Proceedings of IEDM Conference 2000, Piscataway, New Jersey*, (Dec. 10, 2000) pp. 753-756.

Yousif et al., "Recent Critical Issues in Si/$Si_{1-x}Ge_x$/Si Heterostructure FET Devices," *Solid-State Electronics*, vol. 45, No. 11 (2001) pp. 1931-1937.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234-2252.

Koester et al., "Extremely High Transconductance $Ge/Si_{0.4}Ge_{0.6}$ p-MOSFET's Grown by UHV-CVD," *IEEE Electron Device Letters*, vol. 21, No. 3 (Mar. 2000) pp. 110-112.

König et al., "p-Type Ge-Channel MODFET's with High Transconductance Grown on Si Substrates," *IEEE Electron Device Letters*, vol. 14, No. 4 (Apr. 1993) pp. 205-207.

Ransom et al., "Gate-Self-Aligned n-channel Germanium MOSFET's," *IEEE Transactions on Electron Devices*, vol. 38, No. 12 (Dec. 1991) pp. 2695.

Bedair, "Atomic layer epitaxy deposition processes," *J. Vac. Sci. Tech. B*, 12(1):179-185 (1994).

Gannavaram, et al., "Low Temperature ($\leq 800°C$.) Recessed Junction Selective Silicon-Germanium Source/Drain Technology for sub-70 nm CMOS," 2000 IEEE IEDM Tech. Dig., pp. 437-440.

Ge et al., "Process-Strained Si (PSS) CMOS Technology Featuring 3D Strain Engineering," 2003 IEEE IEDM Tech. Dig., pp. 73-76.

Ghandhi, VLSI Fabrication Principles Silicon and Gallium Arsenide, 2nd Ed., John Wiley & Sons, Inc., New York, pp. 258-261, 518-522 (1994).

Ghani et al., "A 90nm High Volume Manufacturing Logic Technology Featuring Novel 45nm Gate Length Strained Silicon CMOS Transistors," IEEE IEDM Tech. Dig., 978-980.

Hamada et al., "A New Aspect of Mechanical Stress Effects in Scaled MOS Devices," 38 IEEE Trans. on Electron Devices 4, pp. 895-900 (1991).

Huang et al., "Isolation Process Dependence of Channel Mobility in Thin-Film SOI Devices," 17 IEEE Electron Device Letters 6, pp. 291-293 (1996).

Huang et al., "LOCOS-Induced Stress Effects on Thin-Film SOI Devices," 44 IEEE Transactions on Electron Devices 4, pp. 646-650 (1997).

Huang, et al., "Reduction of Source/Drain Series Resistance and Its Impact on Device Performance for PMOS Transistors with Raised $Si_{1-x}Ge_x$ Source/Drain," 21 IEEE Electron Device Letters 9, pp. 448-450 (2000).

Iida et al., "Thermal behavior of residual strain in silicon-on-insulator bonded wafer and effects on electron mobility," Solid-State Electronics, vol. 43, pp. 1117-1120 (1999).

International Search Report for PCT/US02/19384, dated Nov. 11, 2002.

International Search Report for PCT/US02/19607, dated Oct. 10, 2002.

International Search Report for PCT/US03/17275, dated Oct. 14, 2003.

International Search Report for PCT/US03/18123, dated Dec. 1, 2003.

Ito et al., "Mechanical Stress Effect on Etch-Stop Nitride and its Impact on Deep Submicron Transistor Design," 2000 IEEE IEDM Tech. Dig., pp. 247-250.

Kim, "Atomic layer deposition of metal and nitride thin films: Current research efforts and applications for semiconductor device processing," J. Vac. Sci. Tech. B, 21(6):2231-2261 (2003).

Liu et al., "Novel Sidewall Strained-Si Channel nMOSFET," 1999 IEDM, pp. 63-66.

Lochtefeld, et al., "Investigating the Relationship Between Electron Mobility and Velocity in Deeply Scaled NMOS via Mechanical Stress," 22 IEEE Electron Device Letters 12, pp. 591-593 (2001).

Meyerson, "UHV/CVD Growth of Si and Si:Ge Alloys: Chemistry, Physics, and Device Applications," Proceedings of the IEEE, 80(10):1592-1608 (1992).

Ootsuka et al., "A Highly Dense, High-Performance 130nm node CMOS Technology for Large Scale System-on-a-Chip Applications," 2000 IEEE IEDM Tech. Dig., pp. 575-578.

Ota et al., "Novel Locally Strained Channel Technique for High Performance 55nm CMOS," 2002 IEEE IEDM Tech. Dig., pp. 27-30.

Shimizu et al., "Local Mechanical-Stress Control (LMC): A New Technique for CMOS-Performance Enhancement," 2001 IEEE IEDM Tech. Dig., pp. 433-436.

Thompson et al., "A 90 nm Logic Technology Featuring 50nm Strained-Silicon Channel Transistors, 7 layers of Cu Interconnects, Low k ILD, and 1um² SRAM Cell," 2002 IEEE IEDM Tech. Dig., pp. 61-64.

Thompson et al., "A Logic Nanotechnology Featuring Strained-Silicon," IEEE Electron Device Letters, vol. 25, No. 4 (Apr. 2004), pp. 191-193.

Tiwari et al., "Hole Mobility Improvement in Silicon-on-Insulator and Bulk Silicon Transistors Using Local Strain," 1997 IEEE IEDM Tech. Dig., pp. 939-941.

Uchino, et al., "A Raised Source/Drain Technology Using In-situ P-doped SiGe and B-doped Si for 0.1-μm CMOS ULSIs," 1997 IEEE IEDM Tech. Dig., pp. 479-482.

Öztürk, et al., "Advanced $Si_{1-x}Ge_x$ Source/Drain and Contact Technologies for Sub-70 nm CMOS," IEEE IEDM Tech. Dig., pp. 375-378.

Öztürk, et al., "Low Resistivity Nickel Germanosilicide Contacts to Ultra-Shallow $Si_{1-x}Ge_x$ Source/Drain Junctions for Nanoscale CMOS," 2003 IEEE IEDM Tech. Dig., pp. 497-500.

Öztürk, et al., "Selective Silicon-Gremanium Source/Drain Technology for Nanoscale CMOS," Mat. Res. Soc. Symp. Proc., vol. 717, (2002), pp. C4.1.1-C4.1.12.

Öztürk, et al., "Ultra-Shallow Source/Drain Junctions for Nanoscale CMOS Using Selective Silicon-Germanium Technology," Extended Abstracts of Intl. Workshop on Junction Technology, pp. 77-82 (2001).

* cited by examiner

METHODS OF FABRICATING DUAL LAYER SEMICONDUCTOR DEVICES

RELATED APPLICATIONS

This application is a continuation of and claims benefit of and priority to U.S. application Ser. No. 10/216,085, filed Aug. 9, 2002, which claims the benefit of U.S. Provisional Patent Application Ser. No. 60/311,188, filed Aug. 9, 2001; the entire contents of both applications are incorporated herein by reference.

TECHNICAL FIELD

The invention generally relates to semiconductor devices, and, more particularly, to the fabrication and structure of devices that include metal-oxide-semiconductor type components.

BACKGROUND INFORMATION

Newer types of substrates can be used as replacements for traditional silicon wafers to improve silicon-based electronic device performance. For example, wafers that have a silicon-germanium (SiGe) alloy layer can provide improved channel-layer performance in a strained-silicon layer grown on a relaxed, i.e., relatively strain-free, SiGe layer. Strained silicon can provide improved minority carrier mobility for a surface-channel layer in, for example, metal-oxide-semiconductor (MOS) field-effect transistors (FET).

The carrier mobility of the silicon channel layer generally increases with the level of strain in the layer. The level of strain is determined by the lattice mismatch with the underlying relaxed SiGe layer. The lattice mismatch, in turn, is determined by the Ge concentration of the relaxed SiGe layer. That is, the lattice spacing of a relaxed SiGe layer generally increases with increasing Ge concentration.

Thus, as the Ge concentration in a relaxed SiGe substrate layer is increased, the electron mobility in the overlying strained-silicon channel layer generally increases. The electron mobility generally saturates beyond a Ge concentration of approximately 20 atomic %, but the hole mobility continues to increase as the Ge concentration rises.

The behavior of electron and hole mobility is of particular significance, for example, in the performance of an inverter, one of the basic building blocks of integrated circuit devices. An inverter includes both an NMOS (i.e., n-channel) and PMOS (i.e., p-channel) transistor, and the inverter delay is dependent upon both the NMOS and PMOS transistor drive currents. With mobility enhancements of the electron and hole charge carriers, the drive current increases, and the inverter stage delay decreases.

An inverter delay is a function of both the NMOS and PMOS device transconductance. The delay can be described as:

$$t_p \approx \frac{C_L}{2}\left(\frac{1}{K_p} + \frac{1}{K_n}\right)$$

where $K_i = C v_{sat} C_{ox} W_i$, "i" represents p or n, and $t_p$ is the total inverter delay time. The delay is related to the ability of the NMOS and PMOS transistors to drive the inverter capacitance, $C_L$. $K_p$ and $K_n$ are, respectively, related to the transconductance of the PMOS and NMOS transistors. C is a constant, $v_{sat}$ is the saturation velocity of the carrier in the channel, $C_{ox}$ is the gate capacitance per unit area, and $W_i$ is the width of the corresponding NMOS or PMOS transistor (i.e., the width of the gate).

The NMOS and PMOS transistors of a conventional Si inverter can be designed to provide approximately equal driving capabilities by appropriately adjusting the widths of the devices. In this case, the following expression aids in an estimate of improvement in inverter performance:

$$t_p \approx \frac{B}{2}\left(\frac{1}{e_p \omega_p} + \frac{1}{e_n \omega_n}\right),$$

where B is a constant, $e_p$ is the enhancement factor in PMOS drive current due to channel improvement relative to a standard silicon component (e.g., through use of strained-silicon), $e_n$ is the enhancement factor in NMOS drive current, $\omega_p$ is any relative width change in the PMOS transistor (new width divided by the width of standard a standard silicon PMOS component in a reference standard inverter), and $\omega_n$ is any relative width change in the NMOS transistor. This expression is an approximation because any large change in device width can affect the constant B, which is associated with the overall inverter capacitance.

A standard Si inverter is typically optimized to minimize stage delay by widening the PMOS transistor in order to balance the current drive in the NMOS and PMOS transistors. This requirement arises because standard silicon devices have a much higher NMOS drive current than PMOS drive current (due to electrons having a much higher mobility than holes in unstrained silicon).

Strained silicon with 20 atomic % Ge on a relaxed SiGe substrate can increase electron mobility by approximately 80%, with a hole mobility at best only slightly enhanced. Thus, strained silicon can cause an increase in mobility mismatch, and, therefore, an increase in drive current mismatch between the NMOS and PMOS transistors in the inverter. Therefore, the inverter stage delay generally does not decrease by a full 80% when strained silicon is employed as a channel layer.

As the germanium concentration in a relaxed SiGe substrate rises to 30% and to 40%, the hole mobility increases, respectively, by approximately 40% and over 100%. Beyond a concentration of 40%, little or no further enhancement of the hole mobility occurs. At 40% Ge in the relaxed SiGe substrate, the ratio of the drive currents in the NMOS and PMOS transistors generally is nearly the same ratio as in a standard device.

Thus, asymmetrical mobilities and transistor sizes remain a problem for inverters and other semiconductor devices.

SUMMARY OF THE INVENTION

The invention involves structures and fabrication methods for semiconductor devices that include a channel layer having a dual-layer structure. The channel layer is preferably a shared surface-channel layer for more than one component in the device. The channel layer provides enhanced electron mobility and, in particular, enhanced hole mobility. The channel layer can serve as a surface channel layer for both PMOS and NMOS components fabricated on a common substrate.

The dual-layer structure preferably includes a silicon layer that overlies and is preferably in contact with a $Si_{1-y}Ge_y$ or germanium layer. The silicon layer preferably is in contact with a gate dielectric.

Inverters, according to principles of the invention, can be fabricated with PMOS and NMOS transistors of similar size. The inverters can then consume less space on a substrate, in comparison to asymmetrical inverters. The inverters can have a stage delay that is decreased relative to other inverters.

Accordingly, in a first aspect, the invention features a semiconductor-based device, which includes a channel layer. The channel layer includes a distal layer and a proximal layer in contact with the distal layer. The distal layer supports at least a portion of hole conduction for at least one p-channel component. The proximal layer has a thickness that permits a hole wave function to effectively extend from the proximal layer into the distal layer to facilitate hole conduction by the distal layer. The proximal layer supports at least a portion of electron conduction for at least one n-channel component.

Each p-channel component can include a p-channel transistor, and each n-channel component can include an n-channel transistor. The components thus can share a common channel layer, and can be operated as surface channel layer components. The n-channel transistor and the p-channel transistor can be associated with, for example, an inverter.

By enhancing hole mobility even more than electron mobility, inverters having transistors of a similar area size or having a similar dimension can be fabricated. For example, n-channel and p-channel transistors can be fabricated with similar gate lengths or gate widths.

The thickness of the proximal layer can be less for the p-channel component than for the n-channel component, to extend a greater portion of hole wave functions from the proximal layer into the distal layer.

The proximal layer is preferably under tensile strain. This can be accomplished, for example, with a silicon proximal layer adjacent to a SiGe substrate layer.

The distal layer is preferably under compressive strain. This can be accomplished, for example, with a SiGe distal layer having a higher germanium concentration than an underlying SiGe substrate layer.

Alternatively, the proximal layer can be formed from silicon, and the thickness of the silicon layer can be in a range of approximately 4 nm to approximately 10 nm, preferably 5 nm, to support electron conduction within the proximal layer. The thickness of the distal layer can be in a range of approximately 5 nm to approximately 18 nm.

The device can also include a dielectric layer in contact with the proximal layer. The proximal layer can be formed of strained silicon, and the distal layer formed of strained germanium or of strained SiGe alloy.

The device can further include a relaxed SiGe substrate layer in contact with the distal layer, the relaxed SiGe layer having a germanium concentration in a range of approximately 30 atomic % to approximately 85 atomic %.

In a second aspect, the invention features a method for fabricating a semiconductor-based device. The method includes provision of a distal portion of a channel layer, and provision of a proximal portion of the channel layer, the proximal portion being in contact with the distal portion.

Provision of the proximal portion can include thinning the proximal portion in a location of each p-channel component to enhance the support of hole conduction. Thinning can include reducing the thickness of the proximal layer in the location of each p-channel component while leaving the thickness substantially unchanged in a location of at least one n-channel component.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DESCRIPTION

The invention provides improved semiconductor device designs, for example, improved inverter design. Various features of the invention are well suited to applications utilizing MOS transistors that include, for example, Si, $Si_{1-x}Ge_x$ and/or Ge layers in and or on a substrate.

The term "MOS" is here used to refer generally to semiconductor devices that include a conductive gate spaced at least by an insulting layer from a semiconducting channel layer. The terms "SiGe" and "$Si_{1-x}Ge_x$" are here used interchangeably to refer to silicon-germanium alloys. The term "silicide" is here used to refer to a reaction product of a metal, silicon, and optionally other components, such as germanium. The term "silicide" is also used, less formally, to refer to the reaction product of a metal with an elemental semiconductor, a compound semiconductor or an alloy semiconductor.

Figure 1:
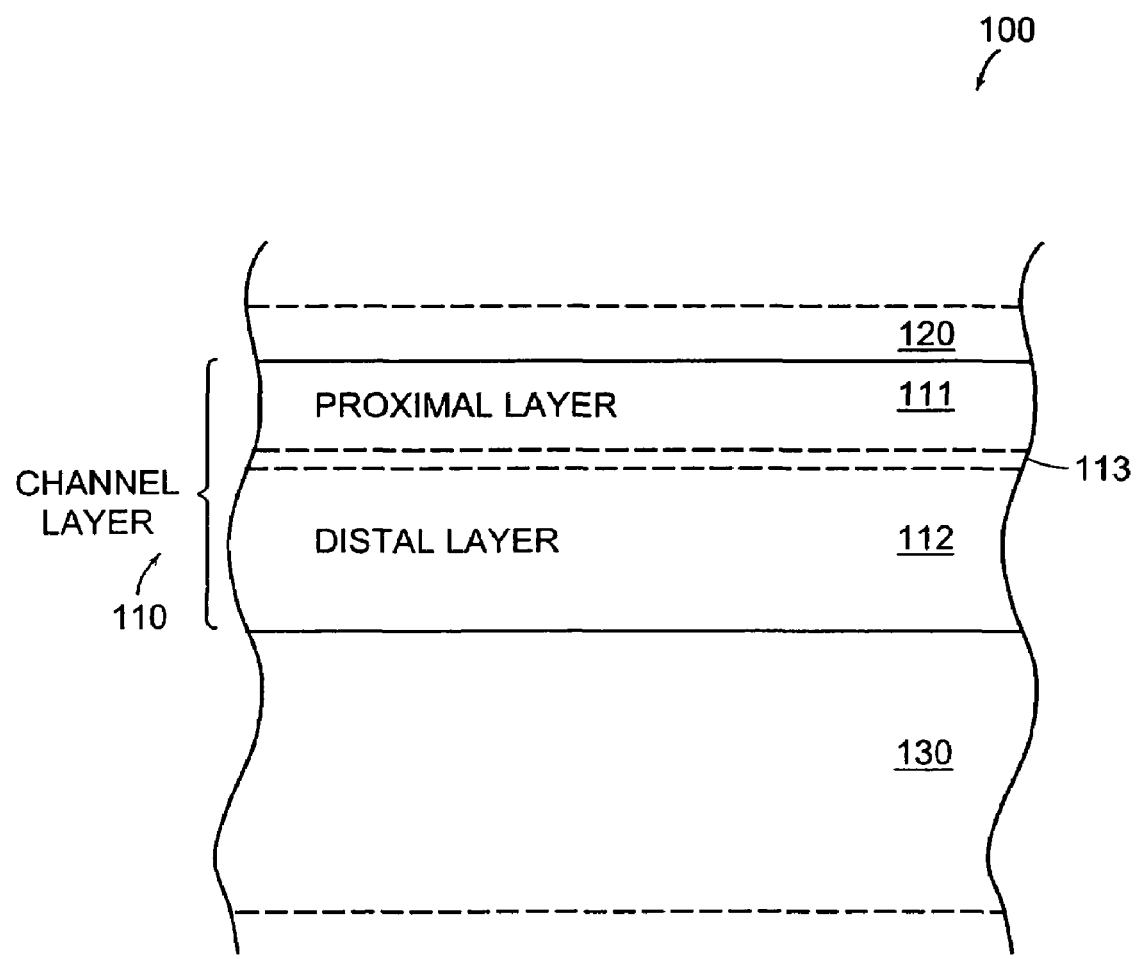
FIG. 1 is cross-sectional view of a portion of an embodiment of a semiconductor-based device.

First, with reference to FIG. 1, some general principles of the invention are described in broad overview. FIG. 1 is a cross-sectional view of a portion of a semiconductor-based device 100. The device 100 includes a channel layer 110, which is preferably a surface channel layer (i.e., in contact with a dielectric layer). The channel layer 110 includes a proximal layer 111 and a distal layer 112.

The channel layer 110 optionally can include one or more intermediate layers 113, though preferably the distal layer 112 and the proximal layer 111 are in contact with each other. Further, the proximal layer 111 is preferably in contact with a dielectric layer 120.

The channel layer 110 further, and optionally, is in contact with a substrate layer 130. The substrate layer 130, such as a relaxed SiGe layer, can control, in part, the level of strain in the distal layer 112 and the proximal layer 111.

The channel layer 110 provides both an n-channel for at least one NMOS component and a p-channel for at least one PMOS component. The components can be MOS transistors, for example, NMOS and PMOS transistors in an inverter, sharing the same surface channel layer. The channel layer 110 provides a dual channel via appropriate selection, in part, of layer thicknesses and compositions.

Although principles of the invention can be applied to devices fabricated from a wide variety of materials, including a wide variety of semiconductor materials, for simplicity, the following description will focus on embodiments that include silicon, germanium and SiGe alloys.

In one implementation of the device 100, the proximal layer 111 is a silicon layer under a tensile strain, the distal layer 112 is a germanium or $Si_{1-y}Ge_y$ layer under a compressive strain, and the distal layer 112 is in contact with the substrate layer 130. The substrate layer 130 includes a relaxed $Si_{1-x}Ge_x$ layer having a lower concentration of germanium than that of the distal layer 112. Thus strain in the proximal layer 111 is largely determined by the concentration of germanium in the relaxed $Si_{1-x}Ge_x$ layer, while the strain in the distal layer 112 is largely determined by the difference in germanium concentration between the distal layer 112 and the relaxed $Si_{1-x}Ge_x$ substrate layer 130.

The proximal layer 111 preferably has a thickness minimally sufficient to support electron conduction, that is, to provide an n-channel for one or more NMOS components. For a silicon layer of the presently described implementation, the silicon thickness is approximately 5 nm.

For silicon thicknesses less than approximately 4 nm, some loss of electron mobility will generally occur. Hole mobility in the channel layer 110, however, generally benefits from reduction in the thickness of the proximal layer 111. The wave function of a hole, perpendicular to the channel layer 110 interfaces, is relatively large due to a relatively small mass of holes in this direction. Thus, in the case of a silicon proximal layer 111, a hole wave function generally extends well beyond the silicon proximal layer 111 into the underlying distal layer 112.

The channel layer 110 then provides an enhanced hole mobility, in part due to the enhanced hole mobility provided by the compressive germanium or $Si_{1-y}Ge_y$ distal layer. The distal layer 112, in this implementation, has a band-gap offset relative to both the proximal layer 111 and the relaxed SiGe substrate layer 130, which can promote confinement of the extended hole wave function within the compressed distal layer 112. This effect can further promote enhanced hole mobility for a p-channel component in the device 100.

The above-described implementation provides enhanced hole mobility via a number of means. For example, a compressively strained $Si_{1-y}Ge_y$ layer has a greater hole mobility than an unstrained $Si_{1-y}Ge_y$ layer. A greater Ge concentration can also enhance hole mobility.

Further, this implementation can reduce loss of mobility due to scattering of holes at the interface between the dielectric layer 120 and the proximal layer 111. For example, an enhancement-mode surface-channel MOS transistor, as known in the semiconductor arts, forces carriers to traverse the transistor channel while very close to the gate dielectric interface. Such a transistor, when implemented according to principles of the invention, can provide reduced hole scattering due, at least in part, to extension of the hole wave functions beyond the very thin proximal layer 111.

Although the mobility of holes in the distal layer 112 will generally be greater than that in the proximal layer 111, a strained-silicon proximal layer 111 can still provide hole mobility that is enhanced relative to a conventional silicon surface-channel component. Thus, the combined proximal and distal layers 111, 112 can serve to provide highly enhanced hole mobility for p-channel components, while providing enhanced electron mobility for n-channel components.

The electron mass in the vertical direction, i.e., the surface normal direction, is relatively large in strained silicon. Thus, the electron wave function is relatively small in this direction, in comparison to the relatively large wave function for holes. Hence, electrons can be substantially confined within a relatively very thin layer. As indicated above, a strained-silicon layer of approximately 5 nm thickness can support substantially the entire wave function of an electron, while permitting a large portion of a hole wave function to extend beyond the strained-silicon layer.

Figure 2A:
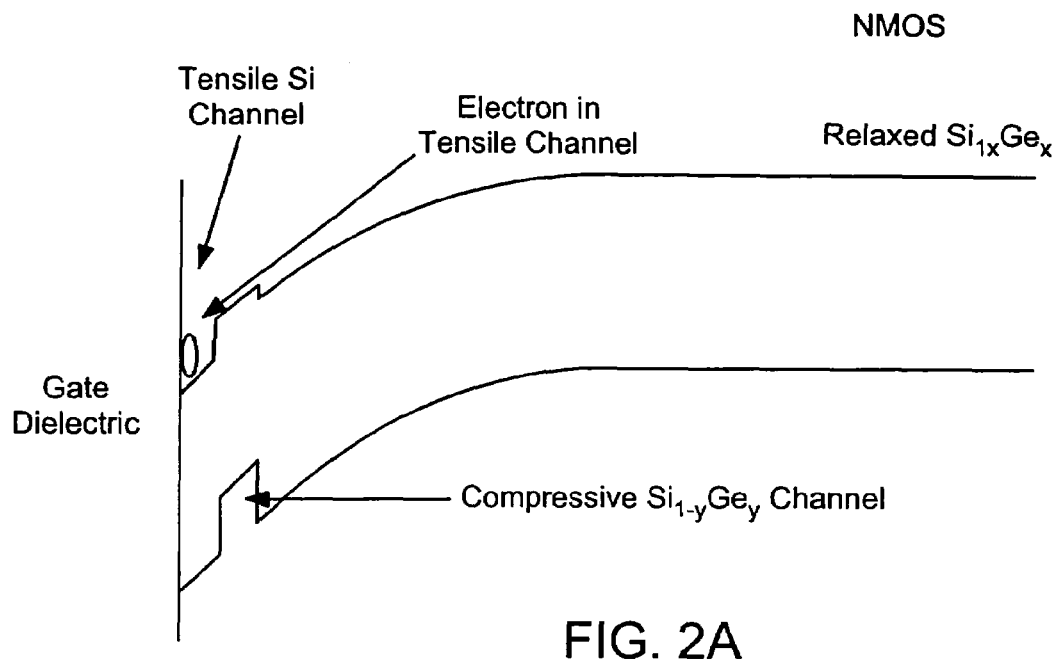
FIG. 2A is a band diagram that illustrates the behavior of electrons for an illustrative NMOS component implementation of the embodiment of FIG. 1.
Figure 2B:
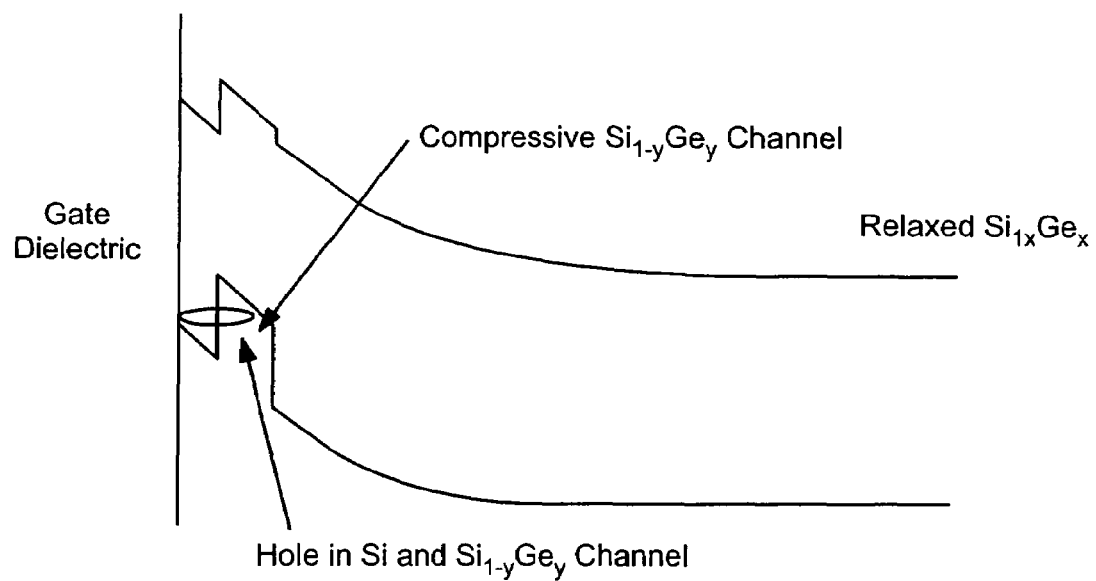
FIG. 2B is a band diagram that illustrates the behavior of holes for an illustrative PMOS component implementation of the embodiment of FIG. 1.

FIGS. 2A and 2B show band diagrams, which illustrate the behavior of electrons and holes for the implementation described above. FIG. 2A illustrates a NMOS component and FIG. 2B illustrates a PMOS component, for embodiments with a tensile silicon proximal layer 111 and with a compressive $Si_{1-y}Ge_y$ distal layer 112. For the NMOS component, the diagram illustrates the confinement of electrons substantially within the proximal layer 111. For the PMOS component, the diagram illustrates the distribution of holes between the proximal layer 111 and the distal layer 112.

As described above, a strained-silicon proximal layer 111 having a thickness of approximately 5 nm can provide a good balance between the tradeoffs of electron confinement within the proximal layer 111 and extension of hole wave function into the distal layer 112. Thicknesses and compositions of layers in some embodiments that utilize silicon and germanium are described next.

In one implementation, the distal layer 112 is essentially 100% germanium. The thickness of the distal layer 112 is preferably in a range of approximately 5 nm to approximately 18 nm. The distal layer 112 is in contact with a substrate layer 130 of relaxed SiGe having a concentration preferably in a range of approximately 60 atomic % Ge to approximately 80 atomic % germanium. This composition can provide an effective level of compressive strain in the distal layer 112 while the germanium concentration in the distal layer 112 (i.e., 100%) further improves hole mobility.

An implementation having a distal layer 112 of germanium, as just described, can lead to stresses in a proximal layer 111 of silicon that will lead to partial or complete relaxation of the silicon. This is so because a pure germanium distal layer 112 is preferably formed on a substrate layer 130 having a relatively high concentration of germanium; the high concentration substrate layer 130 will generally have a relatively very high lattice mismatch relative to the silicon of the proximal layer 111.

Reduction in the concentration of germanium in the substrate layer 130, and related reduction of germanium in the distal layer 112 can substantially reduce or eliminate relaxation of the proximal layer 111. Thus, a relatively high level of tensile stress in the proximal layer 111 can be maintained.

For example, a substrate layer 130 of relaxed SiGe having a composition of approximately 40 atomic % Ge can be used in combination with a distal layer 112 having a composition in a range of approximately 60 atomic % Ge to approximately 80 atomic % germanium. Reduced stress in a silicon proximal layer 111 due to this implementation can preserve the benefits of a tensilely strained silicon layer.

As another alternative, the proximal layer 111 can be reduced in thickness when used in combination with a substrate layer 130 having a relatively large lattice mismatch that will cause a correspondingly large stress in the proximal layer 111. Thus, some thickness of the proximal layer 111 can be sacrificed to preserve a tensile strain in the proximal layer 111.

Figure 3:
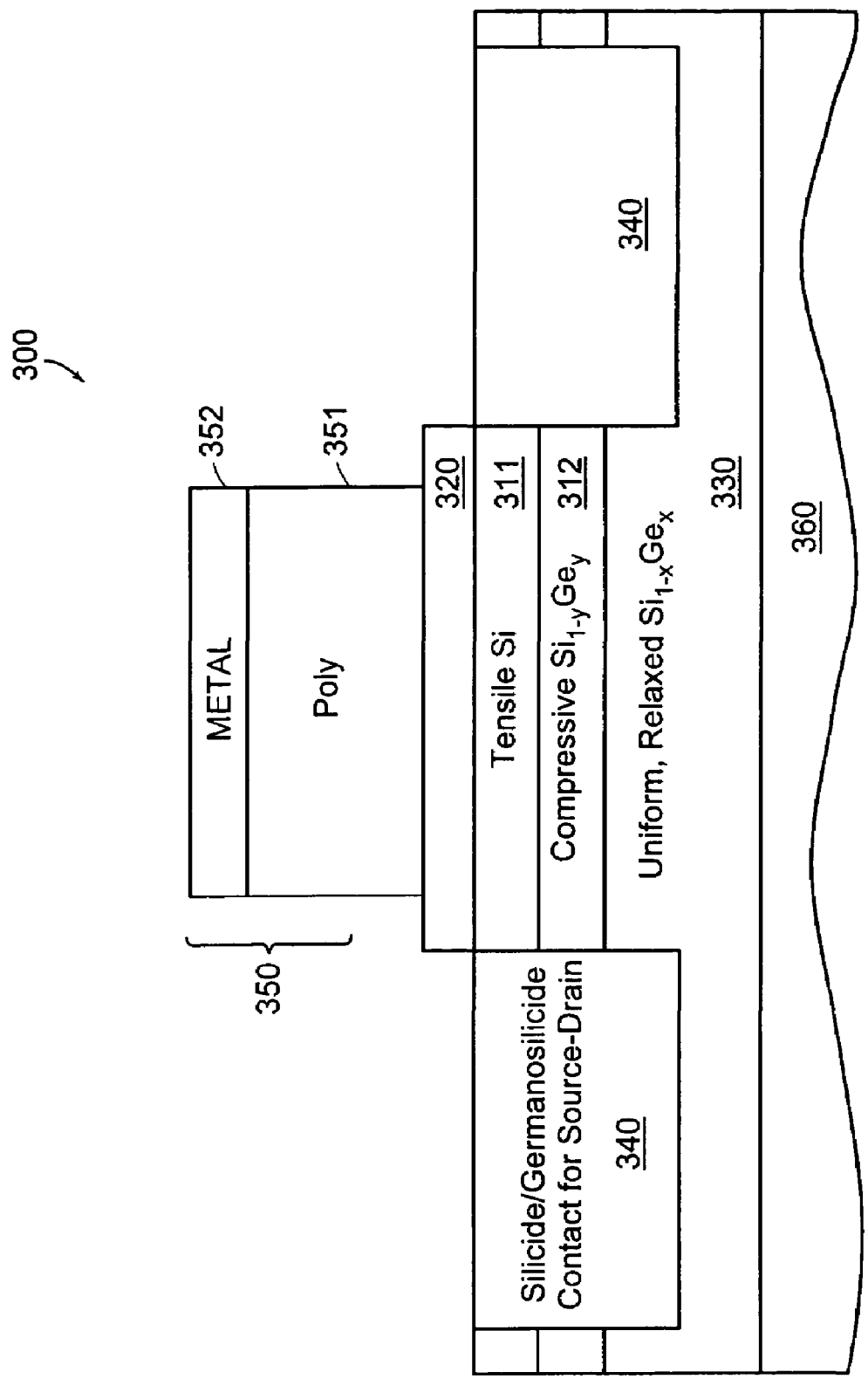
FIG. 3 is a cross-sectional view of an embodiment of a transistor that can be included in a device, according to principles of the invention.

FIG. 3 is a cross-sectional view of an embodiment of a transistor 300 that can be included in a device, according to principles of the invention. The transistor 300 includes a gate contact 350, source and drain silicide contacts 340, a gate oxide layer 320, a channel layer (shared with other components in the device) including a tensile-silicon proximal layer 311 and a compressive $Si_{1-y}Ge_y$ distal layer 312, a relaxed $Si_{1-x}Ge_x$ substrate layer 330, and a silicon substrate 360. The gate contact 350 can include a doped conductive polycrystalline silicon ("polysilicon") lower portion 351 proximal to the gate oxide 320 and a gate silicide upper portion 352.

The tensile silicon proximal layer 311 and the compressive $Si_{1-y}Ge_y$ distal layer 312 can be epitaxially grown on the relaxed $Si_{1-x}Ge_x$ layer 330. These layers provide a channel layer for the transistor 300. The source and drain contacts 340 can be formed, for example, by depositing a metal layer and reacting the metal layer with the channel layer and the relaxed SiGe layer 360.

The gate oxide 320 is formed on the proximal layer 311, possibly consuming a portion of the surface of the strained silicon. The dielectric layer 320 can be formed by various methods conventional in the art, e.g., thermal oxidation or a deposition technique.

The gate oxide 320 can be, for example, a 1.5 to 10.0 nm thick layer of silicon dioxide. Other embodiments include other suitable dielectric materials, e.g., silicon oxynitride, silicon nitride, a plurality of silicon nitride and silicon oxide layers, or a high-k dielectric.

The transistor 300, according to principles of the invention, can be implemented as a NMOS or a PMOS component. The transistor 300 can include, for example, different doping types and levels in the channel layer. A device can thus include NMOS and PMOS transistors 300, utilizing a common channel layer, and both NMOS and PMOS components can provide improved surface channel transistor performance.

Figure 4:
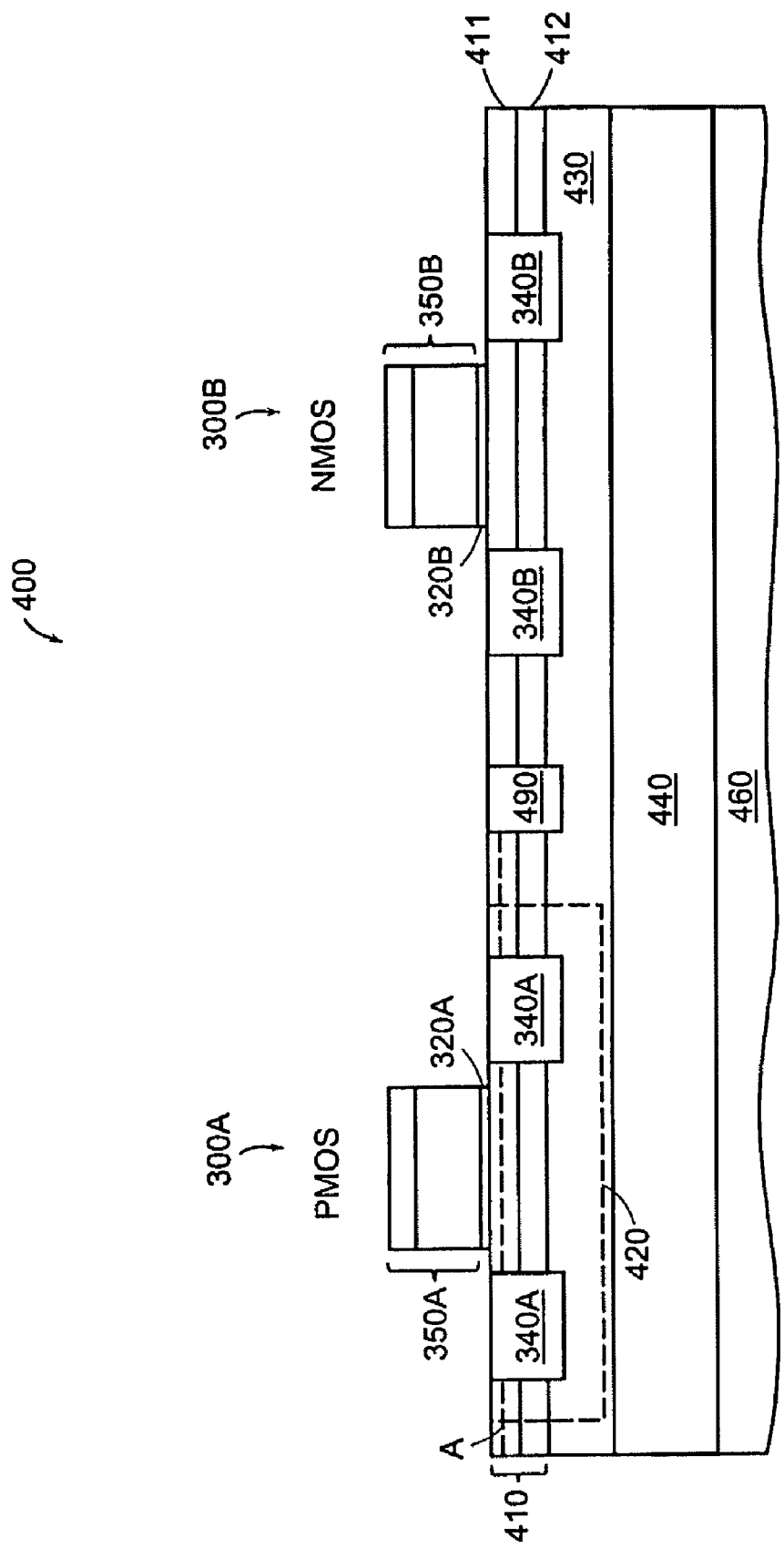
FIG. 4 is a cross-sectional view of an embodiment of a device that includes a PMOS transistor and a NMOS transistor.

Referring now to FIG. 4, features of the invention that permit improved inverters are described. FIG. 4 is a cross-sectional view of a device 400 that includes a PMOS transistor 300A and a NMOS transistor 300B. The transistors 300A, 300B have structures and compositions similar to the embodiment described with respect to FIG. 3.

The transistors 300A, 300B include gate contacts 350A, 350B, source and drain silicide contacts 340A, 340B, and gate oxide portions 320A, 320B. The transistors 300A, 300B share a channel layer 410 that includes a tensile silicon proximal layer 411 and a compressive $Si_{1-y}Ge_y$ distal layer 412. The transistors 300A, 300B also share a relaxed $Si_{1-x}Ge_x$ substrate layer 430, an optional insulating layer 440 (which may include, e.g., $SiO_2$, as described below), and a silicon substrate 460.

The device includes an n-type implanted dopant well 420, within which the PMOS transistor 300A resides. The dopant well 420 can be formed via any of a variety of methods known in the semiconductor fabrication arts. The transistors 300A, 300B are electrically isolated from each other via a shallow trench isolation (STI) portion 490.

The isolation 490 preferably is deep enough to cross the channel layer 410, ending at least in the SiGe relaxed substrate layer 430. In other embodiments, the isolation 490 is absent or replaced by other isolation means. For example, one embodiment includes semi-recessed oxide isolation (S-ROX) portions.

In an alternative implementation of the device 400, the proximal layer 411 in the vicinity of the PMOS transistor 300A is thinned prior to formation of the gate oxide portions 320A. The thinned proximal layer 411 is indicated by the dashed line A in FIG. 4. This alternative can provide a further enhancement of the hole mobility in the channel layer 410 for the PMOS transistor 300A.

Some benefits of the invention when applied to inverter fabrication are described below, with a few illustrative embodiments.

TABLE I

| Row | $\omega_n$ | $\omega_p$ | $e_n$ | $e_p$ | Relative $t_p$ |
|---|---|---|---|---|---|
| 1 | 1 | 1 | 1 | 1 | 1 |
| 2 | 1 | 1 | 1.8 | 1 | 0.78 |
| 3 | 1 | 1 | 1.8 | 1.8 | 0.56 |
| 4 | 1 | 1 | 1.8 | 7 | 0.35 |
| 5 | 2 | 1 | 1.8 | 7 | 0.21 |
| 6 | 2 | 1 | 2.17 | 7 | 0.19 |
| 7 | 2 | 1.17 | 2.17 | 7 | 0.176 |

Table I, above, lists values of relative inverter stage delay ($t_p$) as a function of transistor parameters for seven illustrative inverters. The parameters include: $e_n$ and $e_p$, the enhancement factors, respectively, for the NMOS and PMOS transistor drive currents; $\omega_p$, the relative width change of the PMOS transistor (i.e., PMOS transistor width of an illustrative transistor divided by the width of a standard PMOS transistor of a standard reference inverter); and $\omega_n$, the relative width change of the NMOS transistor of an illustrative inverter.

As shown in the listed examples, inverter stage delay can be reduced to increase inverter performance without decreasing transistor gate length. Table I illustrates the effect of drive current enhancements as well as adjustments of device width on the relative decrease in inverter delay time.

The first row represents a standard reference inverter (that is, no delay decrease). The second row represents an inverter having a strained-silicon channel directly on a relaxed $Si_{0.8}Ge_{0.2}$ substrate. In this case, the electron enhancement factor is 1.8, with the assumption that the hole enhancement has approximately disappeared during processing, leaving an $e_p$ of 1. The delay for this inverter is reduced by a factor of 0.78 relative to the reference inverter.

The third row illustrates an inverter having a strained-silicon layer directly on a relaxed $Si_{0.6}Ge_{0.4}$ substrate. The hole mobility enhancement in the example PMOS component is 1.8.

Further, in this example, the electron and hole enhancements have been selected to be the same. This example inverter design can be particularly advantageous for porting legacy digital circuit designs, since the ratio of NMOS and PMOS mobility has not changed from that of conventional silicon-based inverters.

The fourth row is representative of an inverter in which the NMOS and PMOS transistors include a compressive Ge distal layer and a silicon proximal layer, according to principles of the invention. In this case, the hole enhancement can be, for example, as high as approximately 7. Both the NMOS and PMOS devices have very high carrier mobilities, and the mobilities are approximately the same.

In the fifth row, the illustrative inverter has NMOS and PMOS transistors that are symmetric, i.e., the transitors have the same drive current by adjusting the NMOS component gate width by a factor of approximately 2.

In the sixth row, the illustrative inverter has a silicon proximal layer that has been thinned for both the PMOS and NMOS transistors, and which resides on a compressive germanium distal layer; the electron wave function, as well as the hole wave function, is predominately located in the compressed Ge layer.

In the final row, i.e., the seventh, the PMOS transistor width has been adjusted to make the transistor currents symmetrical.

As illustrated by Table I, application of features of the invention to inverter design can reduce inverter delay by up to 82% or more. Thus, for example, digital circuit performance can be greatly improved without resorting to decreases in transistor gate length.

Figure 5:
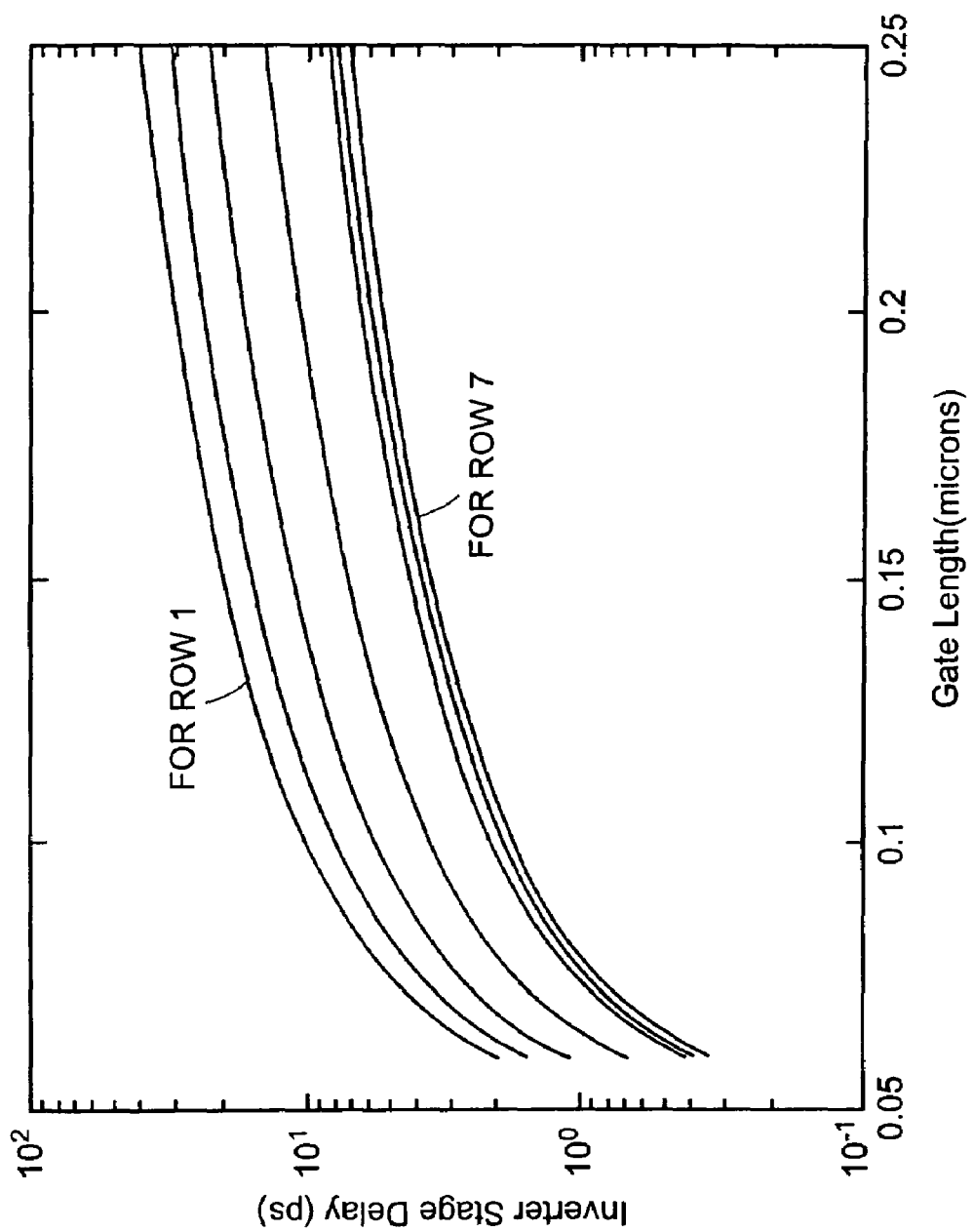
FIG. 5 is a graph of inverter stage delay as a function of gate length data, associated with seven illustrative inverters.

FIG. 5 illustrates inverter stage delay as a function of gate length variations, associated with the seven illustrative inverters of Table I. The top curve (the conventional, and slowest, inverter) corresponds to the first row of Table I. As illustrated, inverters that include dual-channel layers, i.e., a channel layer having a proximal layer and a distal layer according to principles of the invention, can provide performance improvement without reducing device feature dimensions.

As indicated above, some embodiments of the invention utilize a substrate that includes a SiGe substrate layer. The SiGe substrate layer can be grown on a silicon wafer, and can include more than one layer of alloys of varying composition, thickness and growth conditions. Thus, the substrate layer can include a SiGe layer or multiple SiGe layers and/or SiGe layers having a graded composition. In some embodiments, the SiGe layer includes a relaxed SiGe layer grown on intermediate SiGe layers that accommodate the lattice mismatch with a silicon wafer.

The substrate can include, for example, a silicon wafer, with the SiGe layers grown on the silicon wafer. In this case, an oxide layer can be present between the silicon wafer and the SiGe layer. Other types of materials can provide a base or substrate, e.g., silicon-on-insulator (SOI) wafers, germanium wafers, glass substrates and laminated substrates.

Silicon, germanium and SiGe layers can be formed, for example, via known epitaxial growth techniques. Growth of silicon, germanium or SiGe layers of suitable composition and thickness on a SiGe relaxed layer, enables production of a channel layer of controlled stress and dislocation density. Examples of SiGe substrates, in which the Ge content can be up to 100%, include: a relaxed, uniform composition SiGe layer on a graded composition SiGe layer atop a Si substrate; a relaxed, uniform composition SiGe layer directly adjacent to a Si substrate; and a relaxed, uniform composition SiGe layer on an insulating layer like $SiO_2$, adjacent a Si substrate.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A method for fabricating a semiconductor-based device, the method comprising:
    forming a channel layer by:
        providing a compressively strained distal layer to support hole conduction for at least one p-channel component;
        providing a proximal layer in contact with the distal layer and having a thickness less than approximately 4 nm that facilitates hole conduction by the distal layer, the channel layer comprising the distal and the proximal layers;
    forming the at least one p-channel component; and
    forming at least one n-channel component, the at least one p-channel component and the at least one n-channel component each having the channel layer in contact with a dielectric layer,
    wherein the distal layer is in contact with an unstrained substrate layer.

2. The method of claim 1, further comprising providing a substrate layer comprising silicon and germanium, and wherein the proximal layer comprises tensilely strained silicon, and the compressively strained distal layer comprises at least one of compressively strained silicon and germanium.

3. A method for fabricating a semiconductor-based device, the method comprising:
    providing a distal material to support hole conduction for at least one p-channel component;
    providing a proximal material in contact with the distal material and having a thickness less than approximately 4 nm that facilitates hole conduction by the distal material; and
    forming the at least one p-channel component having a channel comprising a portion of the distal material and a portion of the proximal material,
    wherein the channel of the at least one p-channel component is in contact with a dielectric layer, the distal material comprises compressively strained $Si_{1-y}Ge_y$, and the strain in the distal material is induced by relaxed material in contact with the distal material.

4. The method of claim 3, wherein the relaxed material comprises $Si_{1-x}Ge_x$.

5. The method of claim 4, wherein a difference between y and x is selected from a range of 0.2 to 0.4.

6. The method of claim 3, wherein at least a portion of the channel is disposed above the relaxed material.

7. The method of claim 3, wherein the channel comprises silicon.

8. The method of claim 3, wherein the channel is disposed over the relaxed material.

9. The method of claim 3, wherein forming the at least one p-channel component comprises forming a source and a drain proximate the channel, each of the source and the drain comprising compressively strained $Si_{1-y}Ge_y$.

10. A method for fabricating a semiconductor-based device, the method comprising:
    providing an n-channel component comprising a first strained silicon channel; and
    providing a p-channel component comprising a second strained silicon channel proximate a dielectric layer;
    wherein the second strained silicon channel is disposed proximate compressively strained $Si_{1-y}Ge_y$, the n-channel component has a first drive current enhancement relative to an unstrained reference n-channel component, the p-channel component has a second drive current enhancement relative to an unstrained reference p-channel component, and the second drive current enhancement is larger than the first drive current enhancement.

11. The method of claim 10, wherein forming the p-channel component comprises forming a source and a drain proximate the second strained silicon channel, each of the source and the drain comprising compressively strained $Si_{1-y}Ge_y$, and forming the source and the drain comprises forming a germanosilicide contact in each of the source and the drain.

12. The method of claim 10, wherein the first strained silicon channel is tensilely strained.

13. The method of claim 10, further comprising:
    forming a shallow trench isolation region proximate at least one of the n-channel component and the p-channel component.

14. The method of claim 13, wherein the shallow trench isolation region is disposed proximate a material comprising compressively strained $Si_{1-y}Ge_y$.

15. The method of claim 10, wherein the n-channel component and the p-channel component define an inverter.

16. The method of claim 10, wherein the first strained silicon channel and the second strained silicon channel both operate as surface channels during operation.

17. The method of claim 10, wherein the n-channel component and the p-channel component are each provided over an insulating layer disposed within a substrate.

18. The method of claim 17, wherein the insulating layer is disposed under and in direct contact with SiGe.

* * * * *